United States Patent [19]
Hinkel et al.

[11] Patent Number: 4,461,237
[45] Date of Patent: Jul. 24, 1984

[54] PLASMA REACTOR FOR ETCHING AND COATING SUBSTRATES

[75] Inventors: Holger Hinkel, Boeblingen; Gerhard Kaus, Moetzingen; Georg Kraus, Wildberg; Ulrich Kunzel, Kusterdingen; Reinhold Muehl, Altdorf, all of Fed. Rep. of Germany

[73] Assignee: International Business Machines Corporation, Armonk, N.Y.

[21] Appl. No.: 476,290

[22] Filed: Mar. 17, 1983

[30] Foreign Application Priority Data

Mar. 18, 1982 [EP] European Pat. Off. ........ 82102224.1

[51] Int. Cl.³ ............................................. C23C 13/08
[52] U.S. Cl. .................................. 118/50.1; 118/620; 204/164; 204/165; 427/39
[58] Field of Search ............... 427/38, 39, 40, 41; 118/50.1, 620, 723; 204/164, 165; 422/186.04, 186.29

[56] References Cited
U.S. PATENT DOCUMENTS

| | | | |
|---|---|---|---|
| 3,757,733 | 9/1973 | Reinberg | 118/225 |
| 4,148,705 | 4/1979 | Battey et al. | 422/186.29 |
| 4,324,611 | 4/1982 | Vogel et al. | 427/39 |
| 4,333,814 | 6/1982 | Kuyel | 422/186.29 |

Primary Examiner—John H. Newsome
Attorney, Agent, or Firm—Henry Powers

[57] ABSTRACT

A plasma reactor comprises a reaction chamber having two plate-shaped electrodes arranged parallel to and above each other, whereby the substrates are supported on the lower electrode and this electrode is additionally provided with a center opening (5) through which gas is fed into the electrode space or which is evacuated from it, and where (a) the upper electrode is connected to a high frequency AC or RF voltage and (b) which has no electrode material in the regions opposite the substrates and (c) where their position and shape are determined by the substrates on the lower electrode, causing the electric field in the electrode space to be selectively weakened at at least above the substrates.

18 Claims, 6 Drawing Figures

PLASMA REACTOR FOR ETCHING AND COATING SUBSTRATES

FIELD OF THE INVENTION

The invention concerns a plasma reactor for etching and coating substrates, as for example semiconductor wafers, by means of gas particles excited in a gas discharge, comprising two plate-shaped electrodes arranged parallel to and one above the other in a reaction chamber, whereby the upper electrode is connected to a high frequency AC or RF voltage, the substrates are arranged on the lower electrode, and this electrode is additionally provided with a center opening through which the reactive gas is either led into the space between the electrodes or sucked from it, and a method for etching and coating substrates, using such a plasma reactor.

DESCRIPTION OF THE PRIOR ART

Plasma reactors of this kind are described, for example, in DE-OS No. 27 02 165 and U.S. Pat. No. 3,757,733. Although the plasma reactors described, in this prior art, are used to generate or deposit layers, they may also be employed for plasma etching if the process parameters are chosen accordingly. An article by A. R. Reinberg, concerning the plasma deposition of layers as films, was published in the Journal Ann. Rev. Mater. Sci., 1979, 9, p. 341 and subsequent pages, under the title "Plasma Deposition of Inorganic Thin Films". In the Extended Abstracts, Vol. 76-1, of the Electrochemical Society Spring Meeting, May 1976, Abstract No. 50, the same author published a survey of plasma etching entitled "Plasma Etching in Semiconductor Manufacture —A Review".

Plasma etching and plasma deposition are processes in which contamination of the processed substrate, compared to wet chemical processes, is negligible. The present state of the art permits such processsses to be implemented in a highly controlled manner, so that well-controlled results with very small tolerances are obtained. Thus, it is possible during plasma etching to obtain a uniform etch depth with a tolerance of about ±4 percent across the individual substrates and the entire charge or number of substrates positioned on the lower electrode of the plasma reactor and processed simultaneously. This applies in analogy to plasma deposition which permits depositing a layer with a uniform thickness and a tolerance of about ±5 percent across the entire region of the lower electrode. Another feature of plasma deposition is that the characteristics of the deposited layers, for example, their diffraction index and etch rate, are comparable to layers generated by known conventional methods. A disadvantage of plasma processes, which seriously affects their use during manufacture, is the low rate at which substrates can be etched or layers grown on them if the afore-mentioned tolerances have to be observed.

SUMMARY OF THE INVENTION

It is the object of the invention to provide a plasma reactor and a method which can be implemented with this reactor for etching and depositing material at a higher rate than is possible with prior art apparatus and methods, with improved uniformity of etching and deposition, as well as high characteristics in the deposited layers.

This object is accomplished by means of a known plasma reactor of the previously described type with the novel modification disclosed and described herein.

When material is deposited by means of a plasma, there are two concurrent effects that ultimately determine the deposition speed: on the one hand, material formed from the reactive gases is deposited on the substrate and, on the other, the kinetic energy of the particles impinging upon the subtrate causes material to be removed.

It is known with prior art processes to increase the deposition-speed by changing the process parameters, but this has the disadvantage in that drastic changes in the physical-chemical characteristics of the deposited films, as well as an inhomogeneity of deposition, have to be tolerated. A plasma reactor designed in accordance with the invention herein unexpectedly permits depositing films at a higher rate or speed than a reactor not so designed, without changing the process parameters. As the process parameters are unchanged, the deposited films have the same characteristics, for example, the same diffraction index and etch rate, as films deposited by plasma reactors of conventional design. The effect observed may be attributable to a disturbance and weakening of the electrical field outside the regions of the upper electrode in which there is no electrode material. As the weaker electric field below those regions reduces the removal of material caused by the particles impinging upon the substrates, rate-determining surface reactions are encouraged. This leads to a deposition speed exceeding that of known plasma reactors.

The deposition in plasma reactors is not limited to substrates but is effected across the entire lower electrode. If the regions in the upper electrode, which are not provided with electrode material, are positioned and shaped to suit, or opposed conformance to, the substrates on the lower electrode, deposition at increased speed is effected only on the substrates. This has the further advantage that a planar reactor can be used for deposition for a much longer time before the lower electrode has to be cleaned by etching.

During plasma etching, using conventional plasma reactors, the etch active species are formed in the entire electrode space. As a result, many of the etch active species are carried away by the gas flow before being able to develop their etch effect. As previously mentioned, with the plasma reactor according to this invention, the special design of the upper electrode partially disturbs the electric field in the electrode space. A consequence of this is that each etch active species is preferably formed in regions with a disturbed electric field. If the substrates are suitably aligned to the regions in which the electrical field is disturbed, they are exposed to a higher concentration of the etch active species and thus are etched at a higher rate than in known plasma reactors.

BRIEF DESCRIPTION OF THE DRAWINGS

The invention will be described below by means of examples with reference to drawings in which.

DESCRIPTION OF THE PREFERRED EMBODIMENTS

Figure 1A:
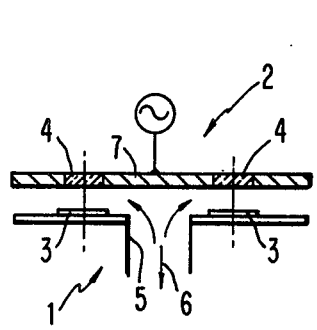
FIGS. 1A to 3B are schematics of cross-sectional and plan views of three examples of the electrode space of the plasma reactor according to the invention.

The plasma reactor according to the invention, which comprises two plate-shaped electrodes arranged parallel to and above each other, differs by the design of the upper electrodes as compared to known plasma reactors.

A known plasma reactor, of the nature as described, for example, in U.S. Pat. No. 3,757,733, comprises in its reaction chamber two plate-shaped, for example, circular electrodes which are arranged parallel to and above each other. The reaction space has at least one gas inlet and one gas outlet connected to a vacuum pump. The upper electrode, which as in U.S. Pat. No. 3,757,733 can comprise the wall of the chamber, is connected to a high-frequency AC voltage. The substrates to be processed, i.e. silicon semiconductor substrates to be etched or coated, are arranged on the lower electrode. The center of the lower electrode is provided with an opening through which the gas required for processing is either fed into the space between the electrodes or evacuated from it. This arrangement ensures that during etching or coating, a continuous gas flow is directed across the substrates either from the edge of the electrode space to the opening in the lower electrode or vice versa. Such a plasma reactor can be used to either coat substrates positioned on the lower electrode with a layer of material, such as silicon nitride, or to etch them, with the latter operation being effected either selectively by using a mask of a material resistant to the etch species or by removing material from the entire substrate surface. During these operations, a glow discharge is maintained between the electrode, which has two effects. On the one hand, the substrates are "bombarded" with ionized gas particles having a high kinetic energy because of the electric fields existing between the electrodes and on the other, gas atoms or molecules are ionized in the glow discharge or are at least chemically excited. Depending upon which material is to be etched or which material is to be used for coating, the gases are chosen accordingly. During plasma etching, the chemical reactions of the etch species with the ionized gas particles cause a chemical-physical removal of the material to be etched and — in unfavourable cases — a redeposition of material previously removed (resputtering). During coating, reactive gases fed to the reaction chamber react chemically, which is promoted or rather made possible by the glow discharge in the electrode space. Bombardment of the substrates during coating has the effect that, on the one hand, the products formed by the chemical reaction are deposited on the substrates more rapidly but that, on the other, material previously deposited on them is removed. The rate at which the substrates are etched or at which material is deposited on them depends on the interaction of the afore-mentioned physical and chemical effects.

With the plasma reactor of this invention, the upper one of the two electrodes has no electrode material in regions whose position and shape are determined by the substrates on the lower electrode. To prevent that, the special design of the upper electrode, as described, influences the gas flow in the electrode space, the electrode material in those regions is replaced by a dielectric material, so that the upper electrode covers at least that part of the lower electrode on which the substrates are arranged. Suprisingly, it was found that when the plasma reactor thus designed is used under conditions which are otherwise the same as those of known processes and arrangements, both the etch and coating rates of the substrates are increased. If, for example, the upper electrode has a circular hole or recess in the electrode material, then, compared to other regions, about 30 percent more silicon nitride (from an appropriate ambient) is grown in a directly subjacent substrate region which, in addition to being concentric with the projection of the hole on the lower electrode, is circular and has a radius that is twice as large as the hole in the upper electrode at an electrode spacing of about 2.5 cm. When the plasma reactor thus designed was used to etch silicon nitride, it was found that the enhanced etch effect, in addition to the circular region, was present in a tapering zone (comet's tail) extending from the location of the hole in the direction of the gas flow. If the plasma reactor is to be used for coating the preferred design of the upper electrode is such that above each of the generally circular substrates there is a circular hole, whose center lies exactly above the center of a respective subjacent substrate and whose diameter is only half as large as that of the substrate. As material is deposited not only on the surface of the substrate but also on the regions of the lower electrode between the substrates, the described design of the upper electrode is advantageous, because with it, the regions in which deposition is effected, at an increased speed, roughly coincide with the substrate surfaces, whereas in the regions in which a deposition of material is unwanted, deposition proceeds at a much lower speed than in the region of the substrates. During etching, conditions are different, because only the substrates or regions on the substrate surfaces are etched, while the regions between the substrates are resistant to etching. Therefore, with the plasma reactors used for etching the design of the upper electrode is uncritical as long as the regions without electrode material on the upper electrode are positioned and shaped in such a manner that the entire surface of each substrate is exposed to the conditions at which etching is effected at the increased rate. Initially it is surprising that, for instance as previously pointed out, a circular hole in the upper electrode—depending upon whether the material is to be deposited or etched—should influence a region of different size and shape on the lower electrode. When being deposited, that region is also circular, whereas when being etched, it is tapered like a comet's tail. This difference is obviously due to the fact that during deposition, the growth process on the very surface to be coated, and thus the surface reactions, are influenced through the hole in the upper electrode; whereas during etching, the concentration of the etch active species is influenced in the space between the electrodes, thus influencing the gas phase reactions. As these species are still influenced by the gas flow, it is understandable that the region with the increased concentration of etch active species does not only comprise the space below the hole and its immediate neighbourhood but also an extension in the direction of the gas flow.

Three examples of the plasma reactor in accordance with the invention will be described below with reference to the accompanying figures which show only those parts of the plasma reactor which are essential to the invention, i.e., for each of the three examples a cross-sectional view of the electrodes and the electrode space and a plan view of the upper electrode.

Figure 1B:
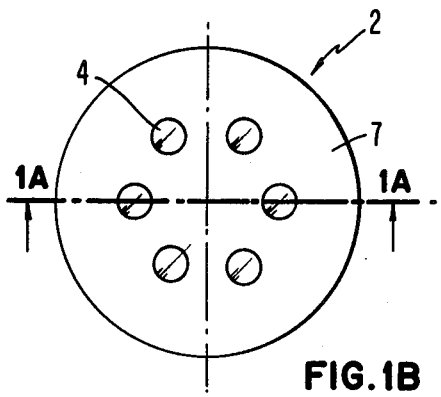

The example shown in FIGS. 1A to 1B is suitable for etching and depositing layers. The plasma reactor has two round electrodes 1 and 2. The electrodes—this holds for all examples of the plasma reactor according to this invention—need not be of the same shape. It is essential that the entire region of the lower electrode 1 (on which substrates 3 are placed) and, if possible, also the opening 5, mentioned below, are covered by regions of electrode 2, which consist either of electrode material 7 or dielectric material 4. This is necessary for optimally guiding the gases across the substrates 3. The upper electrode 2 is connected to a high frequency AC or RF voltage. The substrates 3 to be processed, which may be round semiconductor wafers, are arranged on the lower electrode 1. Above the substrates 3 there are apertures, holes or openings in the material 7 of the electrode, whose centers lie over the center of one subtrate each. whose geometrical shape in the electrode plane is similar to that of the substrates, but whose dimensions from the periphery to the center are 50 percent smaller than the respective dimensions of the substrates. The holes in the electrode material are filled with dielectric or quartz windows 4. In the center, electrode 1 has an opening 5 through which the gas flow 6 is either fed into the space between the electrodes or pumped from it. The electrode arrangement shown in FIG. 1A is positioned in a reaction chamber, not shown, which has at least one supply line for the gases required and suction means connected to a vacuum pump, not shown. The factor by which the hole dimensions are smaller than the substrate dimensions depends on the electrode spacing and reaction criteria to be explained below and has to be determined by test. For the reasons mentioned above, the size ratio hole:substrate, the geometrical similarity of hole and substrate and the position of the hole relative to the substrate are only critical if the plasma reactor is used for depositing material. If the reactor is used for etching the entire substrate must be within that region of the lower electrode in which the appertaining hole in the upper electrode produces an increased etch rate. In other words, if the reactor is used for etching the hole may be larger or as large as the substrate, hole and substrate need not necessarily be geometrically similar, and the centers of holes and substrates need not be positioned exactly above each other.

Figure 2A:
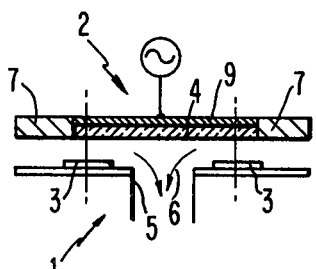
Figure 2B:
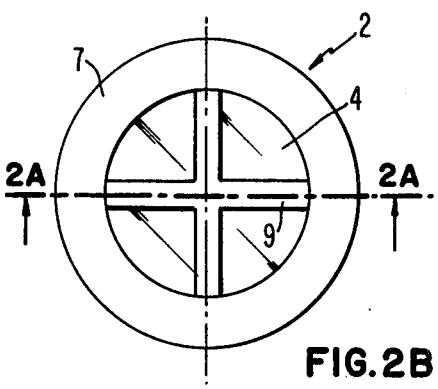

FIGS. 2A and 2B are schematics of cross-sectional and plan views of the electrode arrangement of a further example of the plasma reactor according to the invention. The arrangement has two round electrodes 1 and 2, of which the lower electrode 1 is shaped in the same manner as electrode 1 in FIG. 1A. The upper electrode 2 consists of a circular ring of electrode material 7, whose outer diameter is preferably the same as the outer diameter of electrode 1. The circular ring of electrode material 7 surrounds a circular disk 4 of a dielectric material, for example, quartz, the top side of which, i.e., the surface or side averted or remote from the electrode space, is provided with a conductor pattern 9 which may be cross-shaped, as shown in FIG. 2B, and which serve to electrically interconnect the voltage source and the ring of electrode material. If a plasma is to be formed only between the ring of electrode material 7 and electrode 1 and not also between conductors 9 and electrode 1, it is advantageous for a metal shield, not shown in FIG. 2A and insulated from the ring of electrode material, to be provided on the bottom side of quartz disk 4, i.e., the side facing the electrode space. For the reasons explained above, the example shown in FIGS. 2A and 2B is only favourable for plasma etching. The region of the lower electrode 1, on which substrates 3 must be placed so that their entire surfaces are exposed to the enhanced etch effect, is determined by the circular ring of electrode material 7, and its outer circumference exceeds the inner circumference of the circular ring. The amount by which the two circumferences differ is determined by the electrode spacing and the etch conditions. The gas flow in the example shown in FIGS. 2A and 2B can proceed only in one direction, namely, from the outer edge of the electrode space to opening 5 in the center of electrode 1, from where it is evacuated.

Figure 3A:
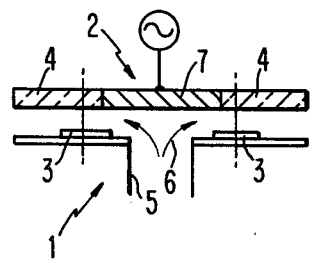
Figure 3B:
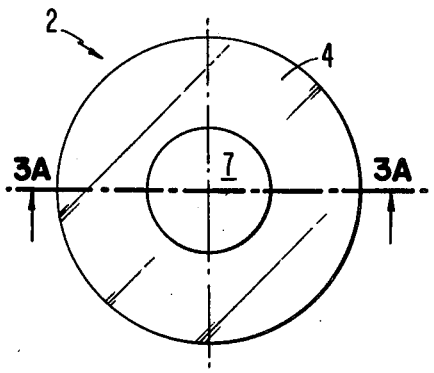

FIGS. 3A and B are cross-sectional and plan views of the electrode arrangements of a third example of the plasma reactor according to the invention. In the illustrated arrangement, two circular, plate-shaped electrodes 1, similar to FIGS. 1A and 2A, are arranged parallel to and facing each other. The upper electrode 2 consists of a circular disk of electrode material 7 and a circular ring 4 of quartz surrounding this circular risk. The circumference of circular ring 4, connected to a high-frequency AC voltage, is about the same as the outer circumference of electrode 1. For the previously explained reasons, the examples shown in FIGS. 3A and 3B are suitable for etching but less suitable for growing layers. The region on the lower electrode 1, within which substrates are etched at the increased rate, is a circular ring, whose inner edge overlaps with the projection of the circular disk of electrode material 7 on electrode 1. The amount of overlap depends upon the electrode spacing and the etching conditions. In the case of the example shown in FIGS. 3A and 3B, gas flows through opening 5 into the electrode space and is sucked off from its outer edge.

The etch and deposition proceses carried out by means of the reactor in accordance with the invention proceed practically under the same conditions as in known conventional reactors. Thus, with the reactor according to the invention, the rate at which a substrate is etched is determined by the composition of the gas mixture used, the gas flow and the pressure of the gases, the electric power, the temperature of the substrates, and the surface kinetics of the gas species participating in the etch process, i.e., phenomena, such as diffusion, adsorption and desorption. The same parameters as mentioned for etching also decisively influence the speed at which layers are grown by means of known plasma reactors. However, when the reactor according to the invention is used, decisive additional parameters are accounted for by design of the upper electrode of the plasma reactor and the positioning of the substrates on the lower electrode, which is adapted to the special design of the upper electrode. When etch or deposition processes are carried out by means of the plasma reactor according to the invention, whose upper electrode may be designed, for example, in accordance with one of the embodiments described by means of FIGS. 1A to 3B, it is necessary for the substrates to be positioned on the lower electrode in such a manner that all of them, with their entire surfaces, are within the regions of the lower electrode where the enhanced etch or growth rate is ensured.

The plasma reactor according to the invention is generally quite suitable for all plasma etching and deposition processes. It can be used to particular advantage for depositing and etching silicon nitride, silicon dioxide and polysilicon, e.g. on silicon semiconductor substrates or wafers.

The etching of substrates and the growing of layers on the substrates, using the plasma reactor according to the invention, will be described in greater detail below with reference to one example each.

EXAMPLE I

The etching of a silicon nitride layer, generated on a silicon wafer by chemical deposition from the gas phase, will be described below in a plasma produced from $CF_4$ and $O_2$. The plasma reactor used had an upper electrode which was designed similarly to that schematically illustrated in FIGS. 1A and 1B. The electrode spacing was 5.2 cm. Part, but not all of the substrates were positioned below a corresponding one of the holes in the electrode material of the upper electrode, and the diameter of the substrates was about twice that of the holes. Several substrates were positioned in regions of the lower electrode that were not influenced by the holes in the upper electrode, i.e., they were not positioned directly below the hole nor in the region of the comet's tail. The test parameters were as follows:

| | |
|---|---|
| $CF_4$ flow | = 480 ml/min (+) |
| $O_2$ flow | = 33 ml/min (+) |
| gas pressure | = 3.33 mbar |
| power | = 300 Watt |
| substrate temperature | = 200° C. |
| etch time | = 90 seconds |

(+) under standard conditions

For the substrate positioned below the holes in the upper electrode, the etch rate determined was 0.59 nm/sec. and for the substrates not influenced by the holes there was an etch rate of 0.21 nm/sec. This means, for the substrates below the holes, that the etch rate was higher by the factor 2.81 than for those not positioned below them. The etch uniformity of the substrates below the holes was ±3 percent as referred to the entire substrate surface.

EXAMPLE II

The following example concerns the growth of a silicon nitride layer on silicon substrates, using a plasma reactor, whose upper electrode was designed as schematically illustrated in FIGS. 1A and 1B. A plasma was generated in an atomosphere containing $SiH_4$, $NH_3$, and Ar. Several but not all substrates lay directly below the holes in the material of the upper electrode, whose diameter was roughly half that of the substrates. Several substrates were positioned on the lower electrode so that their entire surface was outside the regions of the lower electrode that were directly below one of the holes in the upper electrode and had the size of a substrate. The electrode spacing was 2.54 cm. Deposition of the silicon nitride was effected using the following parameters:

| | |
|---|---|
| $SiH_4$ flow (100 percent $SiH_4$) | = 36 ml/min. (+) |
| $NH_3$ flow (++) | = 360 ml/min. (+) |
| Ar flow | = 570 ml/min. (+) |
| gas pressure | = 1.1 mbar |
| substrate temperature | = 200° C. |
| power | = 200 Watt |
| deposition time | = 10 minutes |

(+) under standard conditions
(++) Ar—$NH_3$ mixture with 10 percent by volume $NH_3$ For the substrates positioned below the holes in the lower electrode the deposition speed determined was 0.14 nm/sec. and for those not positioned below them the deposition speed was 0.12 nm/sec., i.e., the deposition speed below the holes was faster by the factor 1.17 than those outside the electrode regions influenced through the holes. Surprisingly, despite different growth rates, all layers grown had the same diffraction index (1.88) and the same etch rate.

While the invention has been illustrated and described with preferred embodiments of this invention, it is to be understood that the invention is not to be limited to the precise construction herein disclosed and the right is reserved to all changes and modifications coming within the scope of the invention as defined in the appended claims.

We claim:

1. A plasma reactor for reactively etching and coating substrates in an excited reactive gas ambient, comprising;
   A. a pair of planar opposed and spaced electrodes, with one of said electrodes adapted to support said substrates and the second of said electrodes having apertures containing a dielectric medium for and opposite each of said substrates,
   B. means for generating a plasma between said electrodes, and
   C. means for flowing a reactive ambient radially across said substrates between said electrodes.

2. The reactor of claim 1 wherein said dielectric medium is quartz.

3. The reactor of claim 1 wherein said apertures are concentric with their affiliated substrates.

4. The reactor of claim 3 wherein said dielectric medium comprises an inset of quartz.

5. The reactor of claim 3 wherein said aperture and said substrate are circular, and wherein the diameter of said apertures are half that of said substrates.

6. The reactor of claim 5 wherein said dielectric medium comprises an inset of quartz.

7. The reactor of claim 1 wherein said aperture has a geometric configuration of an affiliated one of said substrates.

8. The reactor of claim 7 wherein said dielectric medium is quartz.

9. The reactor of claim 7 wherein said apertures are concentric with their affiliated substrates.

10. The reactor of claim 9 wherein said dielectric medium comprises an inset of quartz.

11. The reactor of claim 1 wherein said aperture and said substrate are circular, and wherein the diameter of said apertures are half that of said substrates.

12. The reactor of claim 11 wherein said dielectric medium comprises an inset of quartz.

13. A plasma reactor for reactively etching and coating substrates in an excited reactive gas ambient, comprising;
   A. a pair of planar opposed and spaced electrodes with one of said electrodes adapted to support said substrates, and the second of said electrodes having a annular dielectric medium inset therein to overlap the major portion of said substrate on the said one electrode,
   B. means for generating a plasma between said electrodes, and
   C. means for flowing a reactive gas ambient radially across said substrates between said electrodes.

14. The reactor of claim 13 wherein said dielectric medium comprises an inset of quartz.

15. The reactor of claim 13 wherein said inset comprises a circular dielectric medium concentrically inset therein in spaced relationship to the periphery of said one electrode.

16. The reactor of claim 15 wherein said dielectric medium comprises an inset of quartz.

17. The reactor of claim 13 wherein said inset comprises an annular dielectric ring defining the outer peripheral portions of said one electrode.

18. The reactor of claim 17 wherein said dielectric medium comprises an inset of quartz.

* * * * *